(12) United States Patent
Suzuki

(10) Patent No.: US 6,238,991 B1
(45) Date of Patent: May 29, 2001

(54) FABRICATION PROCESS OF SEMICONDUCTOR DEVICE HAVING AN EPITAXIAL SUBSTRATE

(75) Inventor: Teruo Suzuki, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/489,942

(22) Filed: Jan. 24, 2000

Related U.S. Application Data

(62) Division of application No. 09/074,492, filed on May 8, 1998, now Pat. No. 6,037,647.

(51) Int. Cl.⁷ ................................................ H01C 21/331
(52) U.S. Cl. ........................ 438/357; 438/199; 438/607
(58) Field of Search .................................. 458/341, 357, 458/358, 226, 607, 199

(56) References Cited

U.S. PATENT DOCUMENTS

| 5,241,210 | 8/1993 | Nakagawa et al. | 257/509 |
|---|---|---|---|
| 5,378,920 | * 1/1995 | Nakagawa et al. | 257/487 |
| 5,411,898 | * 5/1995 | Kinoshita et al. | 438/322 |
| 5,895,953 | 4/1999 | Beasom | 257/509 |

FOREIGN PATENT DOCUMENTS 5-129525   5/1993   (JP).

* cited by examiner

Primary Examiner—John F. Niebling
Assistant Examiner—Christopher Lattin
(74) Attorney, Agent, or Firm—Armstrong, Westerman, Hattori, McLeland & Naughton, LLP

(57) ABSTRACT

A semiconductor device formed on an epitaxial substrate includes a high-resistance region in the vicinity of an interface between a doped semiconductor substrate and an epitaxial layer thereon. The high-resistance region is advantageously formed by an ion implantation process of a dopant opposite to a dopant contained in the doped semiconductor substrate such that there is formed a depletion of carriers in the vicinity of the foregoing interface.

11 Claims, 16 Drawing Sheets

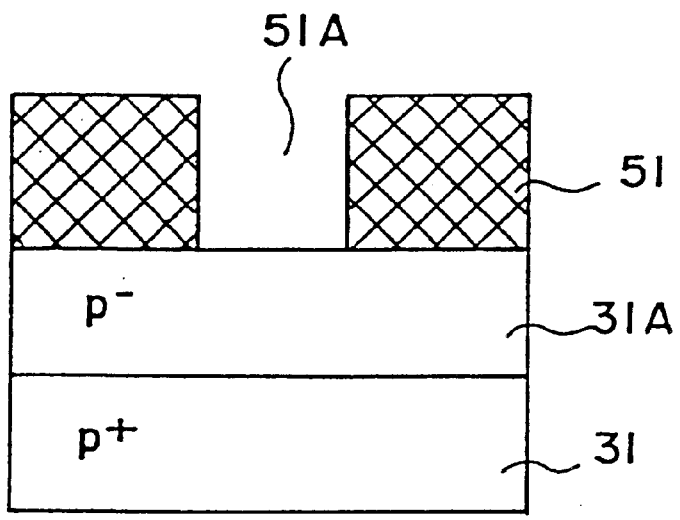
FIG. 15A
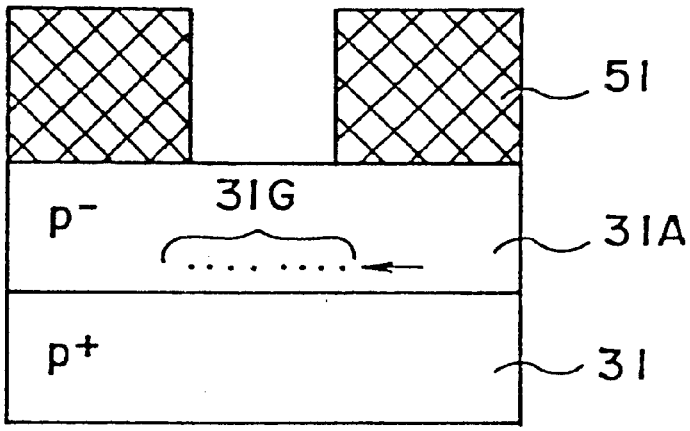
FIG. 15B
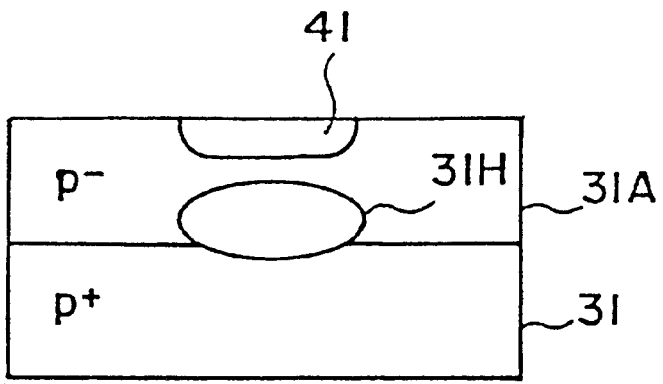
FIG. 15C

FABRICATION PROCESS OF SEMICONDUCTOR DEVICE HAVING AN EPITAXIAL SUBSTRATE

This application is a Division of Ser. No. 09/074,492 filed May, 8, 1998, U.S. Pat. No. 6,037,647.

BACKGROUND OF THE INVENTION

The present invention generally relates to semiconductor devices and more particularly to a semiconductor device formed on a so-called epitaxial substrate in which a semiconductor layer is grown on a semiconductor substrate epitaxially.

With the advancement in the art of ultra-fine lithography, semiconductor devices are miniaturized more and more. Today, so-called submicron or sub-halfmicron devices are studied intensively.

In such recent submicron or sub-halfmicron devices, there tends to arise a problem in that low density crystal defects, which cannot be avoided even in a high-quality single crystal Si substrate, cause an adversary effect on the operation of the semiconductor device formed on the Si substrate. Thus, in order to screen the effect of the crystal defects in the Si substrate, it is proposed to use an epitaxial substrate in which a Si layer is formed on the Si substrate epitaxially, for the substrate of highly miniaturized semiconductor devices.

When a conventional Si substrate is used for carrying a CMOS device, it is well known that there tends to occur a problem of latch-up of a parasitic thyristor that is formed in the Si substrate as a result of formation of diffusion regions of the CMOS device. When the semiconductor device is miniaturized, the parasitic thyristor easily causes a latch up and the normal operation of the semiconductor device is seriously disturbed. The use of the foregoing epitaxial substrate is quite effective for eliminating the problem of the latch-up of the parasitic thyristor. Further, the leakage current of the semiconductor devices is reduced significantly when such an epitaxial substrate is used for the substrate of the semiconductor devices.

FIG. 1 shows the principle of elimination of the problem of latch-up of a CMOS integrated circuit by the use of an epitaxial substrate.

Referring to FIG. 1, there is formed a p⁻-type epitaxial layer 1A of Si on a Si layer 1 of the p⁺-type, and the p-type epitaxial layer 1A is formed with diffusion regions 3 and 5 as a source region or a drain region of an n-channel MOS transistor $T_1$. Further, the p-type epitaxial layer 1A is formed with an n-type well 2 adjacent to the n-channel MOS transistor $T_1$, and diffusion regions 4 and 6 are formed therein as a source region or a drain region of a p-channel MOS transistor $T_2$ that is formed in the n-type well 2.

It should be noted that the CMOS integrated circuit of FIG. 1 includes a gate insulation film 7 and a gate electrode 9 on the epitaxial layer 1A in correspondence to the channel region of the MOS transistor $T_1$. Further, the CMOS integrated circuit includes a gate insulation film 8 and a gate electrode 10 on the epitaxial layer 1A in correspondence to the n-type well 2. Further, the epitaxial layer 1A and the n-type well 2 include a p⁺-type diffusion region 11 and an n⁺-type diffusion region 12 respectively, for stabilizing the potential thereof.

In the CMOS integrated circuit of FIG. 1, it can be seen that there is formed a parasitic thyristor in the Si substrate such that the thyristor includes a parasitic npn transistor 13 and a parasitic pnp transistor 14, wherein the parasitic npn transistor 13 includes a base formed of the epitaxial layer 1A itself, an emitter formed of the n⁺-type diffusion region 3 and a collector formed of the n-type well 2. On the other hand, the parasitic pnp transistor 14 includes a base formed of the n-type well 2 itself, an emitter of the p⁺-type diffusion region 4 and a collector of the p-type epitaxial layer 1A.

In the construction of FIG. 1, it can be seen that the base-emitter resistance $R_1$ of the transistor 13 is reduced substantially by disposing the low-resistance p⁺-type substrate 1 underneath the epitaxial layer 1A. Thus, the turning-on of the transistor 13, and hence the turning-on of the parasitic thyristor, is substantially impeded. It should be noted that the p⁺-type Si substrate 1 forms a low-resistance current path between the base and the emitter of the transistor 13.

Meanwhile, a semiconductor integrated circuit generally includes a protection circuit in a part of the semiconductor substrate forming the semiconductor integrated circuit for avoiding electrostatic damaging of semiconductor devices in the integrated circuit by a voltage surge. Generally, such a protection circuit is formed in the vicinity of an input or electrode pad.

In the case of a semiconductor integrated circuit formed on an epitaxial substrate noted above, it should be noted that the turning-on of the protective circuit tends to be impeded similarly to the case of the parasitic thyristor because of the presence of the low resistance Si substrate underneath the Si epitaxial layer when a voltage surge comes in. Thus, there is a tendency that a semiconductor integrated circuit formed on an epitaxial substrate tends to accumulate electric charges therein. The electric charges thus accumulated are ultimately discharged, causing an electrostatic damaging to the semiconductor devices in the integrated circuit.

FIG. 2 shows an example of a conventional protection circuit used conventionally in semiconductor integrated circuit in a state in which the protection circuit is provided in the epitaxial substrate of FIG. 1, wherein those parts of FIG. 2 corresponding to the parts described previously are designated by the same reference numerals and the description thereof will be omitted.

Referring to FIG. 2, the epitaxial substrate 1A of the p⁻-type is formed with a p-type well 21, wherein the p-type well 21 includes a diffusion region 21A of the n⁺-type and another diffusion region 21B of the n⁺-type such that a field oxide film 22 is interposed between the diffusion region 21A and the diffusion region 21B. The diffusion region 21A is connected to an electrode pad 20 for external connection via a conductor line 20a. The diffusion region 21B is grounded. Further, in order to maintain the potential of the p-type well 21 at the ground level, the well 21 is grounded via a p-type diffusion region 21C formed in the well 21.

In the protection circuit of FIG. 2, it should be noted that an external signal arrived at the electrode pad 20 reaches the diffusion region 21A via the conductor line 20a and forwarded further to an internal circuit not illustrated, via another conductor line 20b. The internal circuit may include the CMOS circuit shown in FIG. 1.

In the protection circuit of FIG. 2, it should be noted that there is formed a lateral bipolar transistor 21a in the p-type well 21 such that the lateral bipolar transistor 21a includes an emitter formed of the n⁺-type diffusion region 21B and a collector formed of the n⁺-type diffusion region 21A. The lateral bipolar transistor 21a thus formed conducts when a large positive surge is applied to the electrode pad 20 and dissipates the electric charges of the surge to the ground. When a large negative surge is applied to the electrode pad 20, on the other hand, a forward biasing occurs in the p-n junction formed between the n⁺-type diffusion region 21A and the p-type well 21, and the electric charges associated with the surge is dissipated to the ground from the diffusion region 21A through the well 21C and further through the diffusion region 21C.

In the case the protection circuit of FIG. 2 is formed in an epitaxial substrate as in the case of FIG. 1, however, it has been discovered that the resistance of the semiconductor devices in the semiconductor integrated circuit against ESD (electrostatic discharge) experiences a serious deterioration. It is believed that this deterioration of the resistance against ESD is caused as a result of the diffusion of the p-type dopant from the highly doped Si substrate 1 to the epitaxial layer 1A. Such a diffusion of the p-type dopant tends to occur in the fabrication of the semiconductor integrated circuit as a result of thermal annealing processes used therein.

When such a diffusion of the p-type dopant occurs, the concentration level of the p-type dopant in the epitaxial layer 1A is increased and the resistance of the epitaxial layer 1A is decreased accordingly. In other words, there appears a state in which the base and emitter of the lateral bipolar transistor 21a forming the protection circuit are effectively connected. In such a state, the turning-on of the transistor 21a is substantially impeded even when a large positive surge voltage is applied to the terminal pad 20, and the surge voltage is applied to the protection circuit as well as to the internal circuit of the integrated circuit, causing an electrostatic damaging therein. Further, the electric charges associated with the voltage surge are accumulated in the protection circuit itself and damages the lateral bipolar transistor 21a.

In the event a large negative voltage surge is applied to the external terminal pad 20, on the other hand, a very large current is caused to flow due to the low resistance of the p-type well 21, wherein such a large current destroys the protection circuit as a result of Joule heating.

FIG. 4 shows the diffusion of B from the Si substrate 1 to the epitaxial layer 1A for the case in which the epitaxial substrate is subjected to a thermal annealing process conducted at 1000° C. for 30 minutes. In the experiment of FIG. 4, it should be noted that the epitaxial layer 1A is formed with a thickness of about 2 $\mu$m and the Si substrate contains B with a concentration level of about $1 \times 10^{19} cm^{-3}$. The epitaxial layer 1A, in turn, is substantially free from doping in the as-formed state and contains B with a concentration level of about $1 \times 10^{15} cm^{-3}$ Referring to FIG. 4, it can be seen that the sharp transition of the B concentration level, observed at the interface between the Si substrate 1 and the epitaxial layer 1A before the thermal annealing process, becomes diffused substantially after the thermal annealing process, indicating that a substantial amount of B atoms have diffused into the epitaxial layer 1A. In the illustrated example, it can be seen that a boundary defining the region in which the B concentration level is $1 \times 10^{19} cm^{-3}$ has moved into the epitaxial layer 1A with a distance of about 1 $\mu$m.

FIG. 5 shows the result of measurement of the resistance of the p-type well 21 in the epitaxial layer 1A for various thicknesses of the epitaxial layer 1A.

Referring to FIG. 5, the result designated as "BULK" is for the case in which the measurement was conducted on a simple Si substrate by regarding the bulk of the p-type Si substrate as the p-type well 21. In this case, in which the thickness of the epitaxial layer 1A can be regarded substantially infinite, it was observed that the resistance of the well 21 is high and takes a value of about 3500 $\Omega$. On the other hand, this value of the resistance decreases with decreasing thickness of the epitaxial layer 1A and reaches less than 100 $\Omega$ when the thickness of the layer 1A becomes smaller than about 2 $\mu$m. This indicates that there is a substantial diffusion of B from the $p^+$-type Si substrate 1 as explained with reference to FIG. 4.

FIG. 6 shows the relationship between the voltage in which the protection circuit is damaged by ESD and the thickness of the epitaxial layer 1A, wherein the test of the ESD is conducted by accumulating a positive or negative voltage surge in a capacitor of 200 pF capacitance and applying the voltage thus accumulated to the protection circuit repeatedly for 5 times with an interval of 0.5 seconds. The damaging of the protection circuit thus tested is evaluated by measuring a leakage current.

Referring to FIG. 6, it can be seen that the voltage or failure voltage in which the foregoing electrostatic damaging occurs in the protection circuit decreases with decreasing thickness of the epitaxial layer 1A for any of the positive and negative surges and reaches a voltage of as low as about 200V when the thickness of the epitaxial layer 1A is reduced to about 2 $\mu$m. Thus, it can be seen that the diffusion of B from the $p^+$-type Si substrate 1 to the epitaxial layer 1A explained with reference to FIG. 4 causes a profound effect on the operation of the semiconductor integrated circuit that is formed on the epitaxial layer 1A.

SUMMARY OF THE INVENTION

Accordingly, it is a general object of the present invention to provide a novel and useful semiconductor device and a fabrication process wherein the problems described heretofore are eliminated.

Another and more specific object of the present invention is to provide a semiconductor device formed on an epitaxial substrate including a doped substrate and an epitaxial layer formed thereon in which the diffusion of a dopant element from the doped substrate to the epitaxial layer is minimized.

Another object of the present invention is to provide a semiconductor device, comprising:

a semiconductor substrate doped with an impurity element to a first impurity concentration level;

an epitaxial layer formed on said semiconductor substrate, said epitaxial layer containing said impurity element with a second impurity concentration level substantially smaller than said first impurity concentration level;

an active device formed on said epitaxial layer; and a barrier layer formed at an interface between said semiconductor substrate and said epitaxial layer for blocking a diffusion of said impurity element from said semiconductor substrate to said epitaxial layer.

Another object of the present invention is to provide a method of fabricating a semiconductor device, comprising the steps of:

forming a barrier layer on a semiconductor substrate doped with an impurity element to a first impurity concentration level, said barrier layer blocking a diffusion of said impurity element thereinto;

forming an epitaxial layer containing said impurity element with a second impurity concentration level substantially smaller than said first impurity concentration level, on said semiconductor substrate such that said epitaxial layer covers said barrier layer; and forming an active device on said epitaxial layer.

According to the present invention, the diffusion of the impurity element from the doped semiconductor substrate to the epitaxial layer is effectively blocked by the barrier layer, and the problem of delayed turning-on of the protection circuit provided in the epitaxial layer for avoiding the electrostatic damaging of the semiconductor device is effectively eliminated.

Another object of the present invention is to provide a semiconductor device, comprising:

a semiconductor substrate doped with an impurity element to a first impurity concentration level;

an epitaxial layer formed on said semiconductor substrate, said epitaxial layer containing said impurity element with a second impurity concentration level substantially smaller than said first impurity concentration level;

an active device formed on said epitaxial layer; and a high-resistance layer formed at an interface between said semiconductor substrate and said epitaxial layer.

According to the present invention, the current path between the epitaxial layer and the highly doped semiconductor substrate is effectively blocked by the high resistance layer and the problem of delayed turning-on of the protection circuit provided in the epitaxial layer for avoiding the electrostatic damaging of the semiconductor devices effectively eliminated.

Another object of the present invention is to provide a method of fabricating a semiconductor device, comprising the steps of:

forming an epitaxial layer on a semiconductor substrate doped by a first impurity element with a first impurity concentration level, such that said epitaxial layer contains said first impurity element with a second impurity concentration level substantially smaller than said first impurity concentration level, said semiconductor substrate and said epitaxial layer thereby forming an epitaxial substrate; and introducing a second impurity element of a conductivity type opposite to a conductivity type of said first impurity element, into said epitaxial substrate in the vicinity of an interface between said semiconductor substrate and said epitaxial layer by an ion implantation process.

According to the present invention, it is possible to form a high resistance region inside the epitaxial substrate after the epitaxial substrate is formed, by introducing the second impurity element such that the second impurity element neutralizes the carriers created in the epitaxial substrate by the first impurity element diffused from the semiconductor substrate into the epitaxial layer. Thereby, the current path between the epitaxial layer and the underlying highly doped semiconductor substrate is effectively blocked and the problem of delayed turning-on of a protection circuit provided in the epitaxial layer for avoiding an electrostatic damaging of the semiconductor device is effectively eliminated.

Other objects and further features of the present invention will become apparent from the following detailed description when read in conjunction with the attached drawings.

BRIEF DESCRIPTION OF THE DRAWINGS

FIGS. 15A–15C are diagrams showing a fabrication process of a semiconductor device according to a second embodiment of the present invention.

DETAILED DESCRIPTION OF THE PREFERRED EMBODIMENTS

PRINCIPLE

Figure 7:
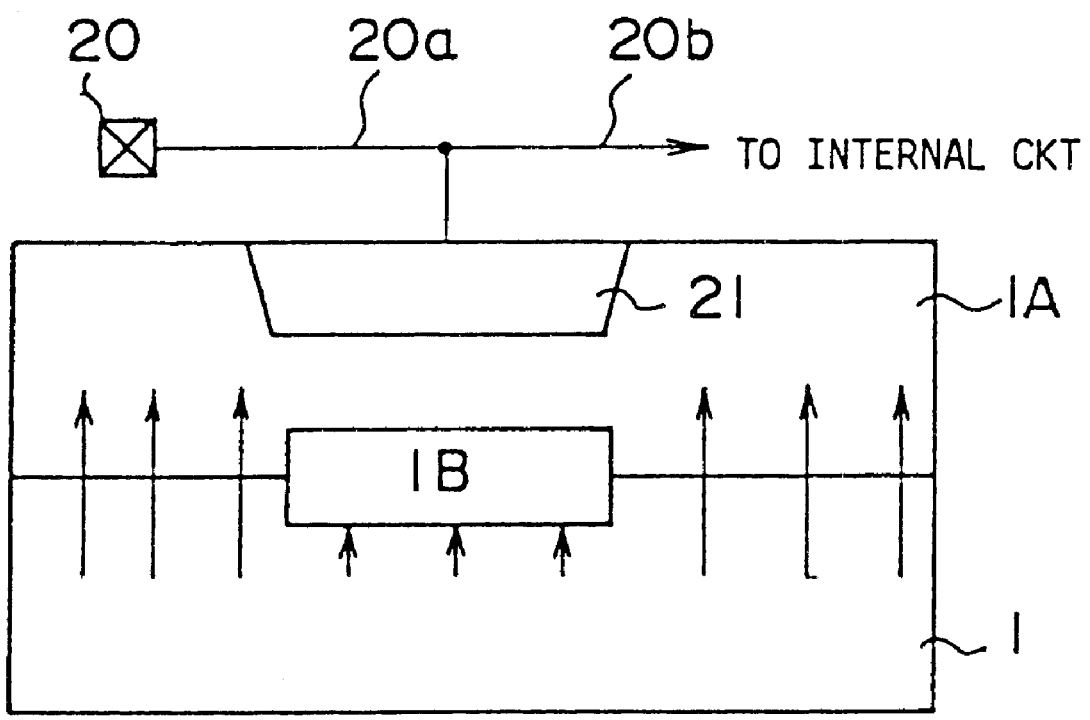
FIG. 7 is a diagram showing the principle of the present invention.

FIG. 7 shows the principle of the present invention, wherein those parts corresponding to the parts described previously are designated by the same reference numerals and the description thereof will be omitted.

Figure 2:
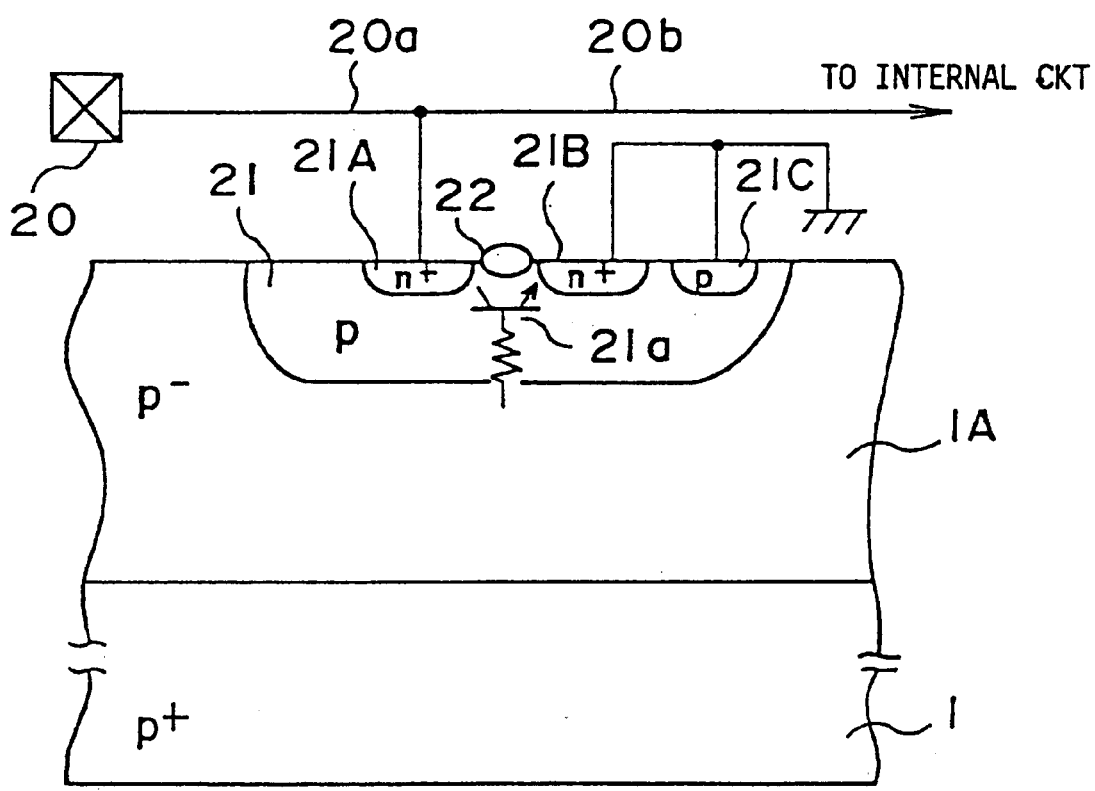
FIG. 2 is a diagram showing the construction of a conventional protection circuit used in a semiconductor integrated circuit.
Figure 3:
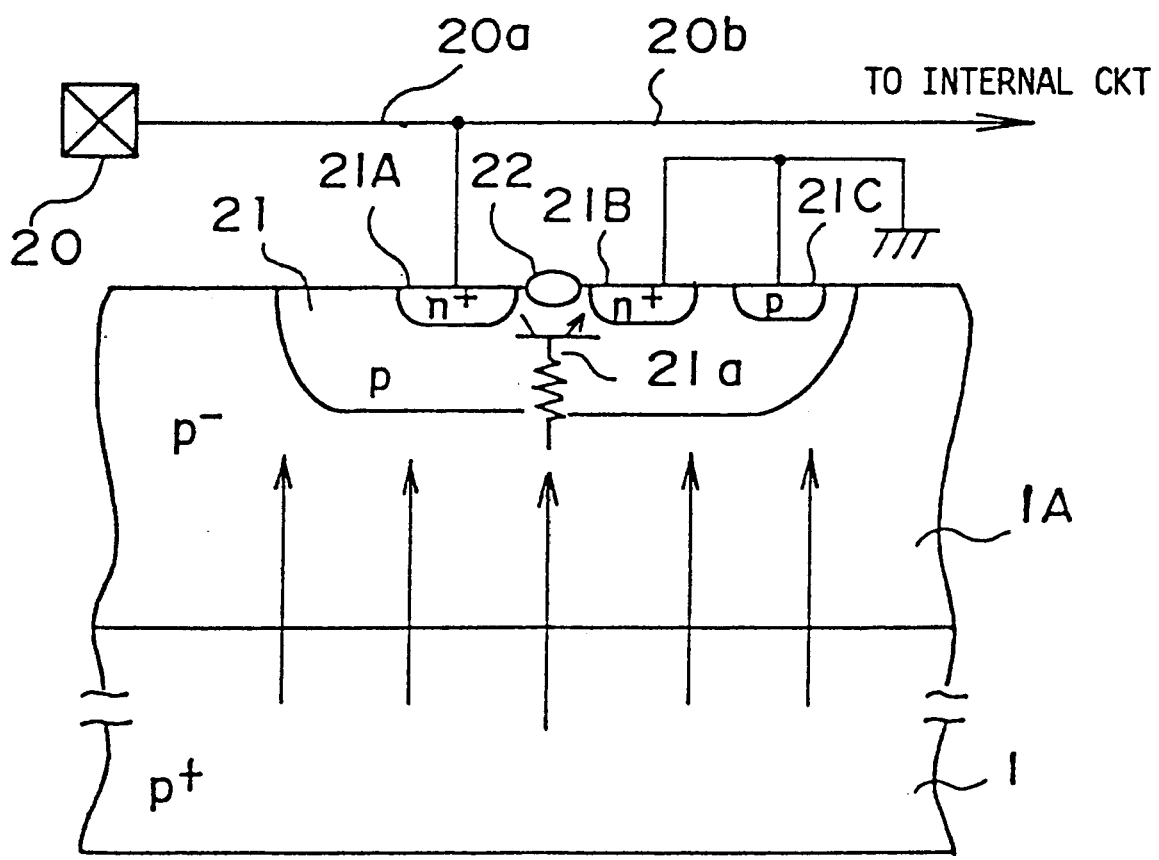
FIG. 3 is a diagram explaining the problem of diffusion of impurity element that occurs in a conventional epitaxial substrate.

Referring to FIG. 7, the present invention provides a high-resistance layer 1B in the epitaxial substrate in the vicinity of an interface between the highly doped semiconductor substrate 1 and the epitaxial substrate 1A such that the high-resistance layer 1B is located right underneath the p-type well 21 in which the protection circuit of FIG. 2 is formed. By forming the protection circuit in the p-type well 21 as such, the protection circuit easily and reliably turns on when a surge comes in from the input or output electrode pad 20 and the surge current is immediately dissipated to the ground. Thereby, the internal circuit of the semiconductor integrated circuit and further the protection circuit itself are effectively protected against electrostatic damaging.

It should be noted that the high-resistance layer 1B may be formed by introducing an impurity element having a conductivity type opposite to the conductivity type of the impurity element contained in the semiconductor substrate 1, into the epitaxial substrate. In this approach, the ion implantation is made to the region in the vicinity of the interface between the semiconductor substrate 1 and the epitaxial layer 1A, with an amount sufficient for canceling out or neutralizing the carriers that are created by the impurity element that have diffused into the epitaxial layer from the semiconductor substrate.

Alternatively, the high-resistance layer 1B may be formed by a diffusion barrier layer that blocks the diffusion of the impurity element, B in the case of FIG. 7, from the highly doped semiconductor substrate 1 to the epitaxial layer 1A. By doing so, the decrease of resistance of the epitaxial layer 1A is effectively suppressed and a normal operation is guaranteed for the protection circuit of FIG. 2. Further, the high-resistance layer 1B may be formed by growing a doped region having a conductivity type opposite to the conductivity type of the highly doped semiconductor substrate 1, on the surface of the semiconductor substrate 1 epitaxially. Thereby, the epitaxial layer 1A is grown on the semiconductor substrate 1 such that the epitaxial layer 1A covers the high-resistance layer 1B. It is preferable that the high-resistance layer 1B is formed right underneath the p-type well 21 in which the protection circuit is formed.

Figure 8:
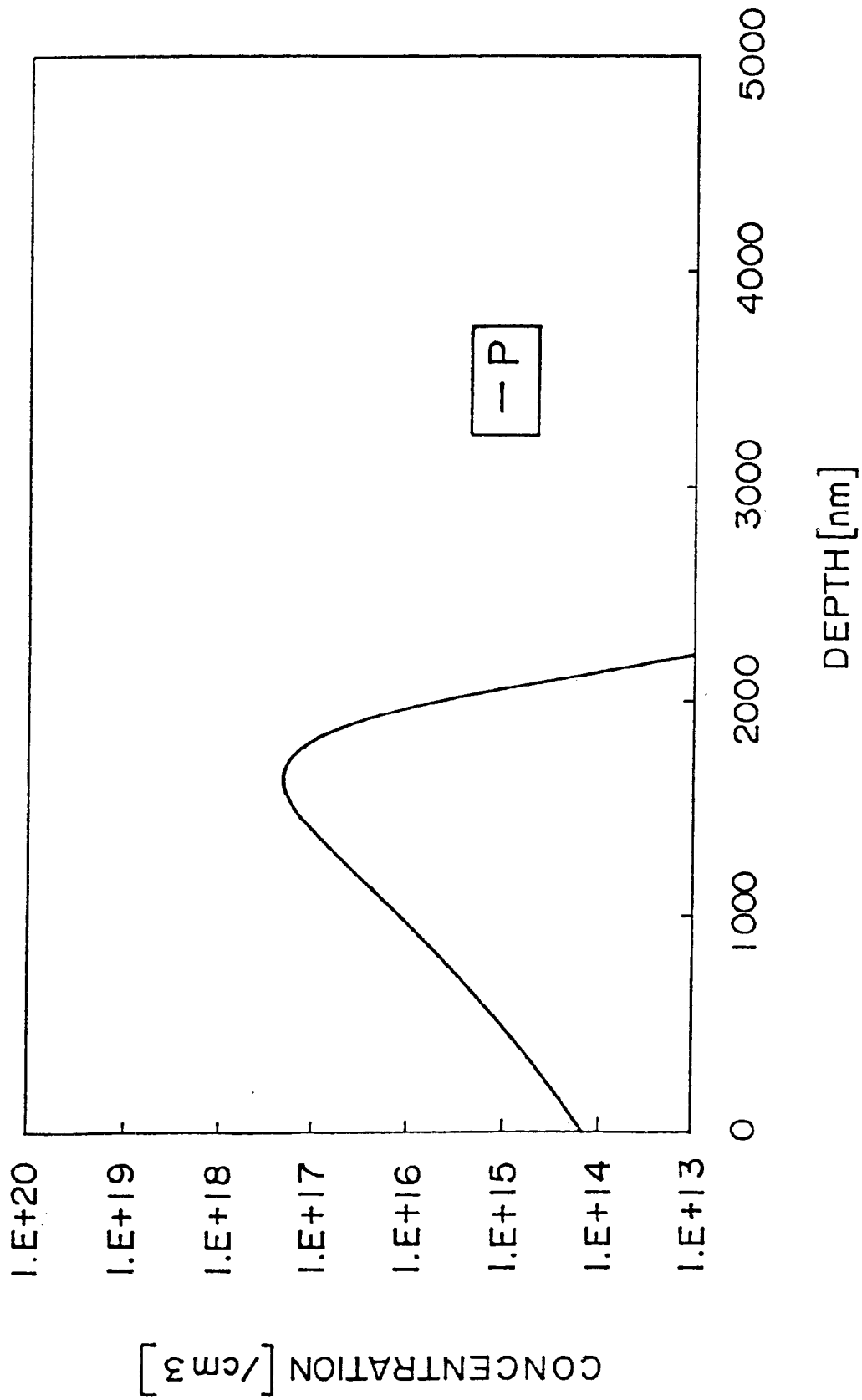
FIG. 8 is another diagram showing the principle of the present invention.

FIG. 8 shows the concentration profile of P introduced into the epitaxial substrate by an ion implantation process for forming the high-resistance layer 1B of FIG. 7, wherein the vertical axis represents the concentration of P while the horizontal axis represents the depth as measured from the top surface of the epitaxial layer 1A. The result of FIG. 8 is for the case in which the epitaxial layer 1A is formed with a thickness of 2 μm.

Figure 4:
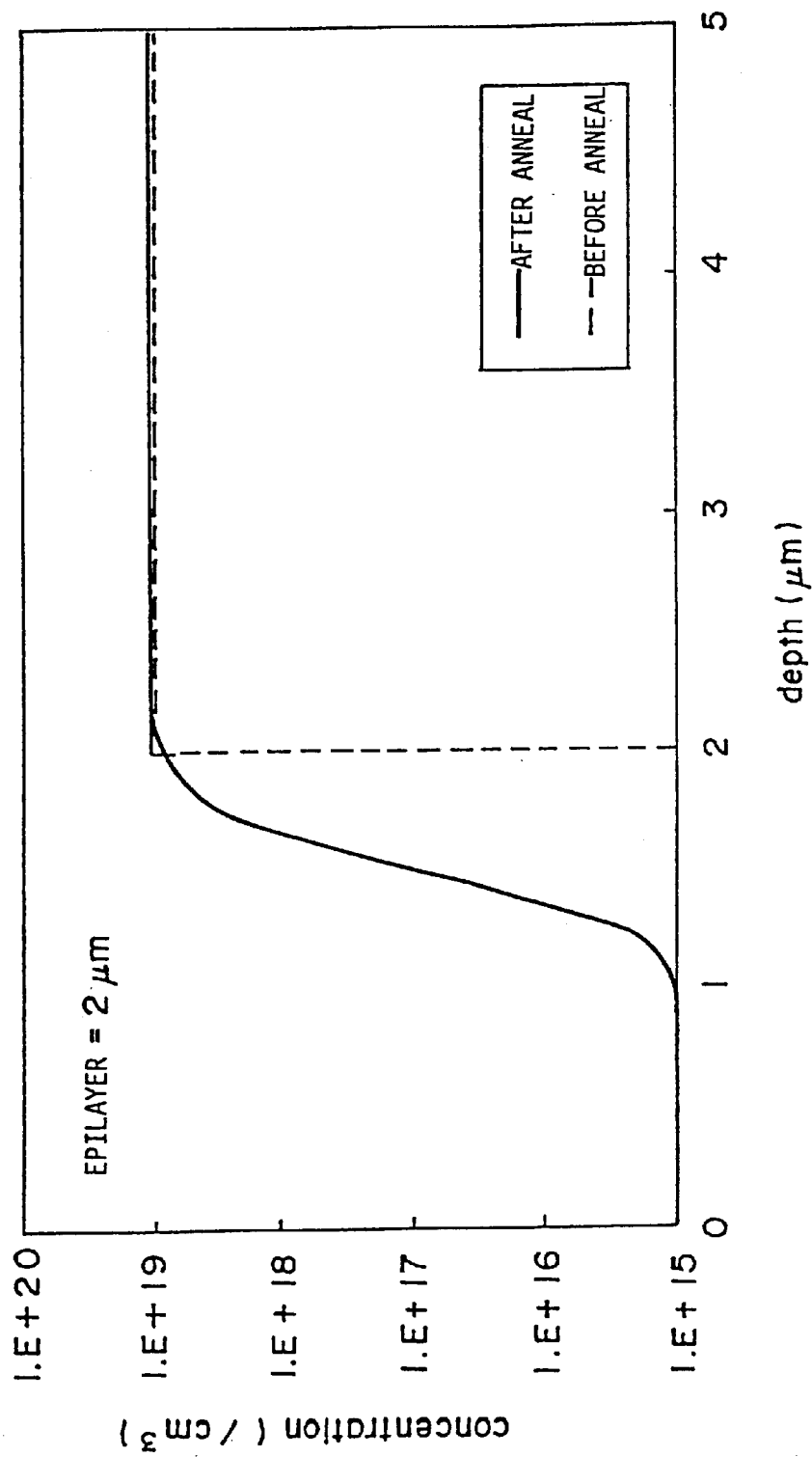
FIG. 4 is a diagram showing the diffusion profile of an impurity element occurring in a conventional epitaxial substrate.
Figure 5:
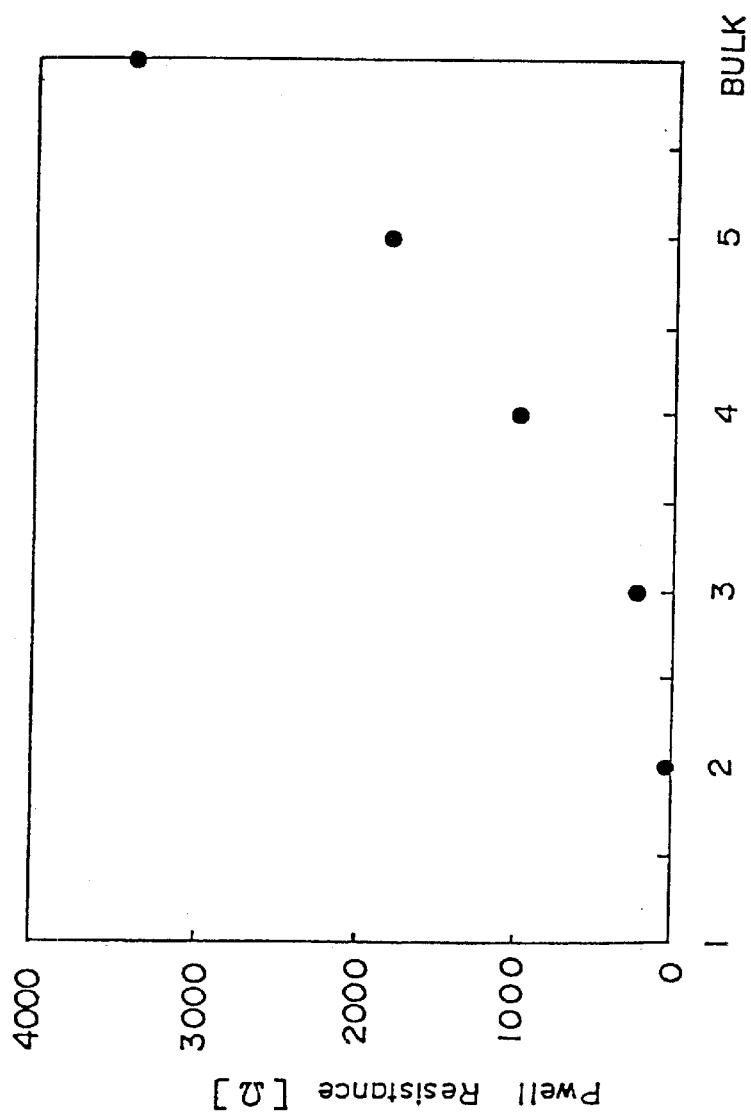
FIG. 5 is a diagram showing the problem that arises in a conventional epitaxial substrate as a result of diffusion of the impurity element.
Figure 6:
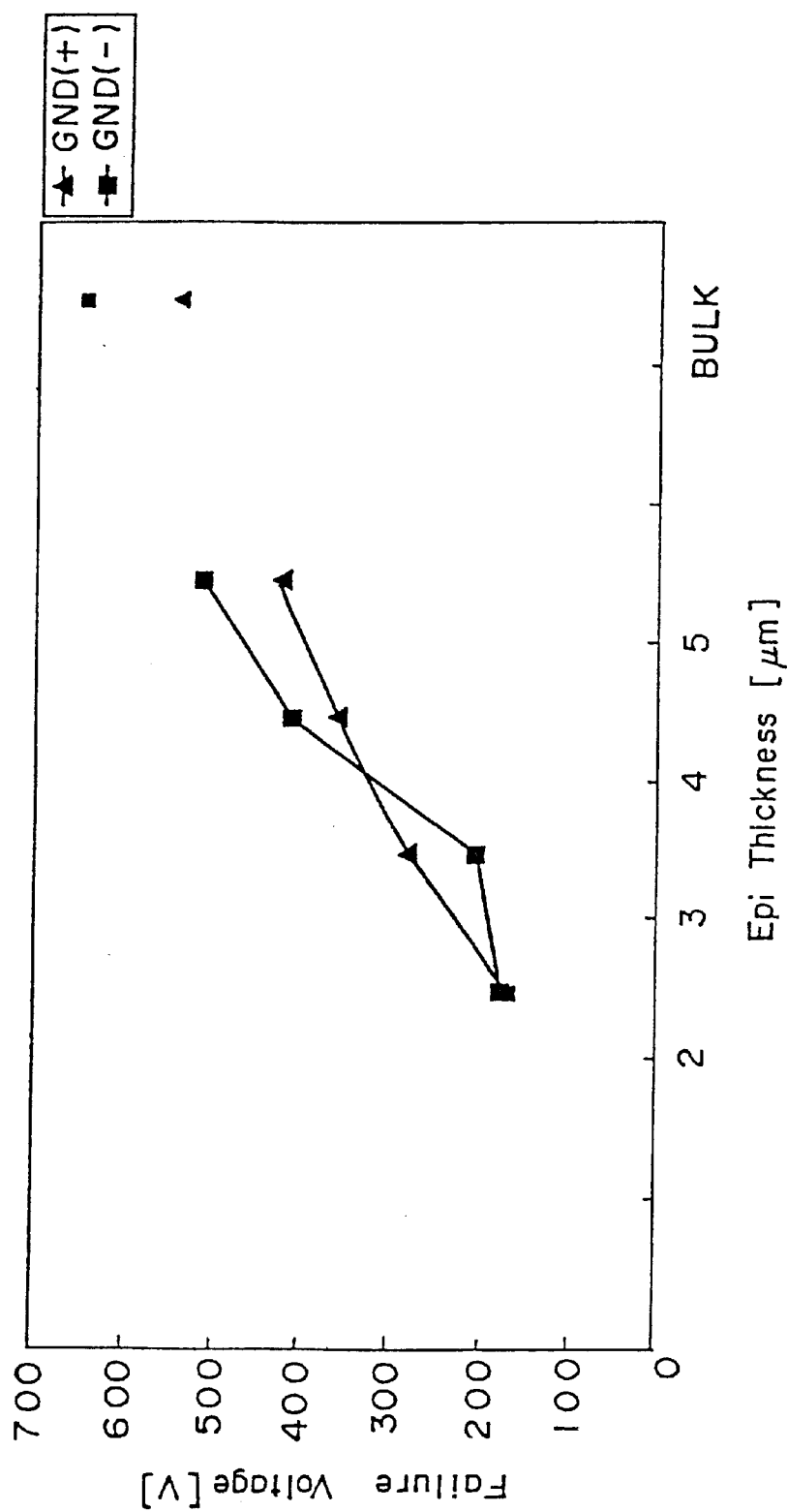
FIG. 6 is another diagram showing the problem that arises in a conventional epitaxial substrate as a result of diffusion of the impurity element.

Referring to FIG. 8, the Si substrate 1 contains B with a concentration level of $1\times10^{19} cm^{-3}$ similarly to the case explained with reference to FIG. 4, and the ion implantation of P is conducted under an acceleration energy of about 1.5 MeV with a dose of about $1\times10^{13} cm^{-2}$, wherein the $P^+$ ions are introduced slightly obliquely with an angle of 2° offset from the vertical direction of the substrate principal surface.

After a thermal diffusion process conducted at 1000° C. for about 30 minutes, it can be seen that there appears a distribution of P such that the peak of the P distribution is located slightly above the interface between the substrate 1 and the epitaxial layer 1A and that the concentration of P at the foregoing peak is about $2\times10^{17} cm^{-3}$. It should be noted that this concentration level of P is, while smaller than the concentration level of B in the Si substrate 1, generally equal to the concentration level of B at the same depth as measured from the surface of the epitaxial layer 1A.

Figure 9:
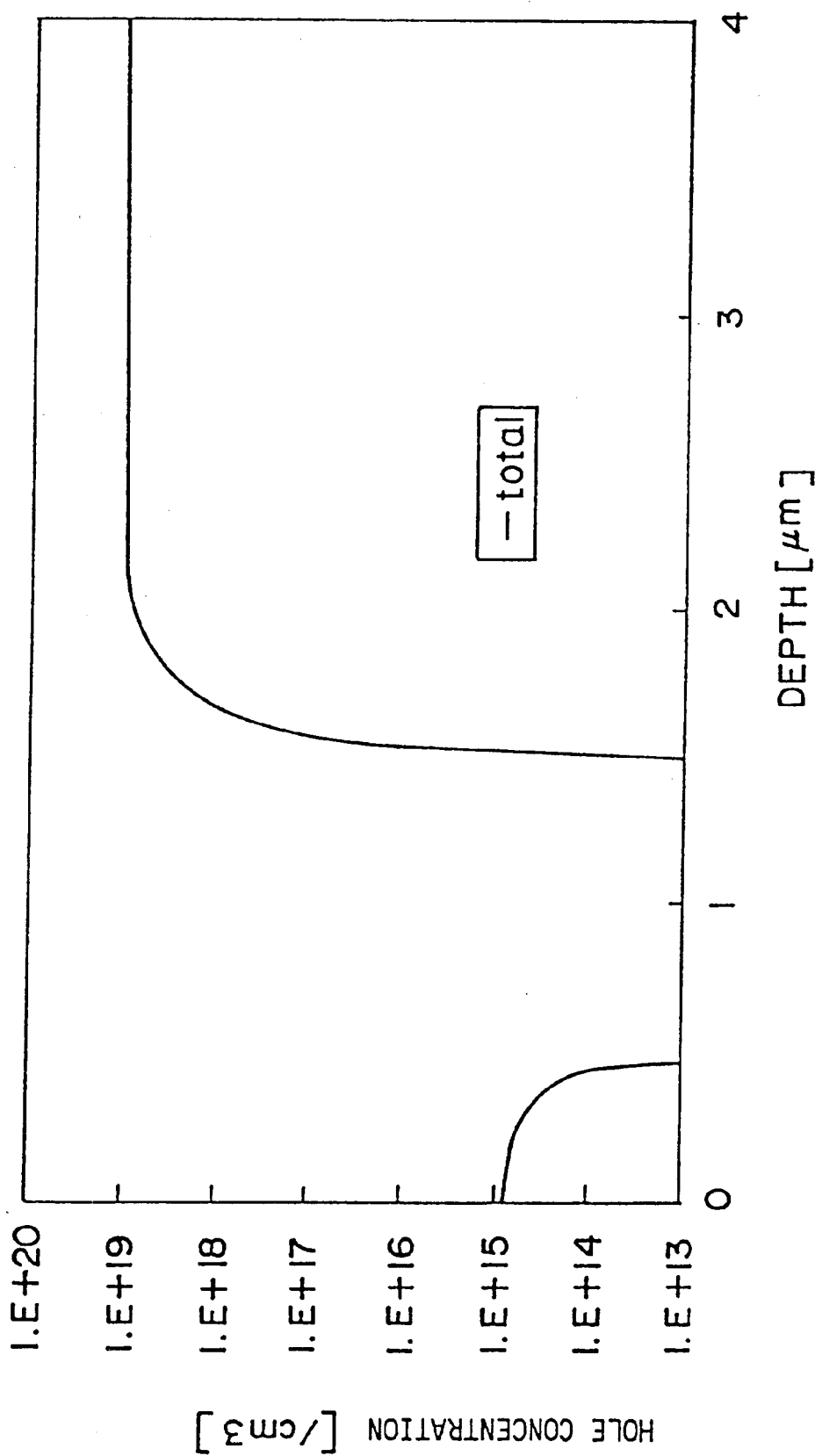
FIG. 9 is another diagram showing the principle of the present invention.

FIG. 9 shows a hole concentration profile appearing in the epitaxial substrate of FIG. 8.

Referring to FIG. 9, it can be seen that there is formed a remarkable depletion of holes in the epitaxial layer 1A in correspondence to the region in which the concentration level of P thus introduced by the ion implantation process exceeds the concentration level of B that have caused a diffusion from the Si substrate 1.

In the ion implantation process of FIG. 8, it is also possible to increase the dose of the $P^+$ ions further. In this case, the conductivity type is changed in correspondence to the high-resistance layer 1B and the layer 1B is doped to the n-type. In such a case, while the layer 1B itself is no longer a high-resistance layer, there is formed a p-n junction by the layer 1B and the Si substrate 1 underneath and the depletion region associated with the p-n junction provides the function of the high-resistance layer.

In the illustrated example of FIG. 8, it should be noted that the dose of P at the surface of the epitaxial layer 1A is set to about $1\times10^{14} cm^{-3}$ so that the conductivity type of the p-type well 21 on the surface of the epitaxial layer 1A is maintained. However, this is not a mandatory condition and the dose of P may be increased further such that the conductivity type of the epitaxial layer 1A is changed. When such a change in the conductivity type is caused at the surface of the epitaxial layer 1A, the original conductivity type is easily restored by simply carrying out an ion implantation process of the desired conductivity type.

Further, it is also possible to form the high resistance layer 1B by a diffusion barrier that blocks the diffusion of the impurity element from the substrate 1, as noted previously.

Figure 10:
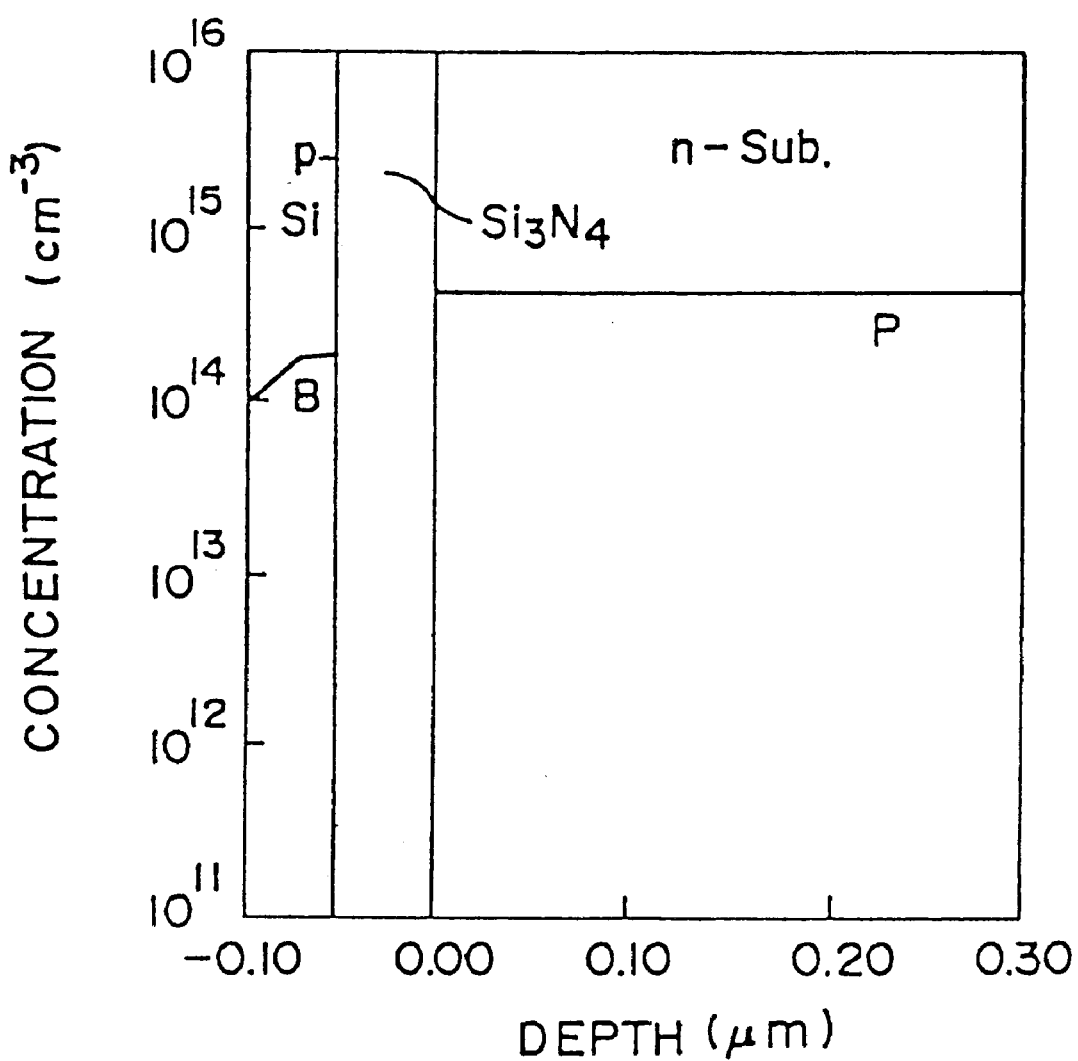
FIG. 10 is another diagram showing the principle of the present invention.

FIG. 10 shows a concentration profile of P and B in the depth direction of the epitaxial substrate for the case in which an SiN layer having a thickness of about 0.05 μm is formed for the high-resistance layer 1B, wherein the profile of FIG. 10 is for the case in which the foregoing epitaxial substrate is subjected to a thermal annealing process conducted at 1000° C. for about 30 minutes. In the example of FIG. 10, the Si substrate 1 is doped by P to the $n^+$-type with a concentration level of about $5\times10^{14} cm^{-3}$ while the epitaxial layer 1A is doped to the p-type by B to a concentration level of about $3\times10^{14} cm^{-3}$. In FIG. 10, the vertical axis represents the impurity concentration level of B and P while the horizontal axis represents the depth as measured from the interface between the epitaxial layer 1A and the underlying Si substrate 1. Thus, the negative depth of FIG. 10 represents the epitaxial layer 1A.

Referring to FIG. 10, it can be seen that the diffusion of P from the Si substrate 1 to the epitaxial layer 1A is substantially completely blocked by the SiN layer 1B. Similarly, the diffusion of B from the epitaxial layer 1A to the Si substrate 1 is also blocked substantially completely. The result clearly indicates that the SiN layer 1B acts as an effective diffusion barrier of B or P.

Figure 11:
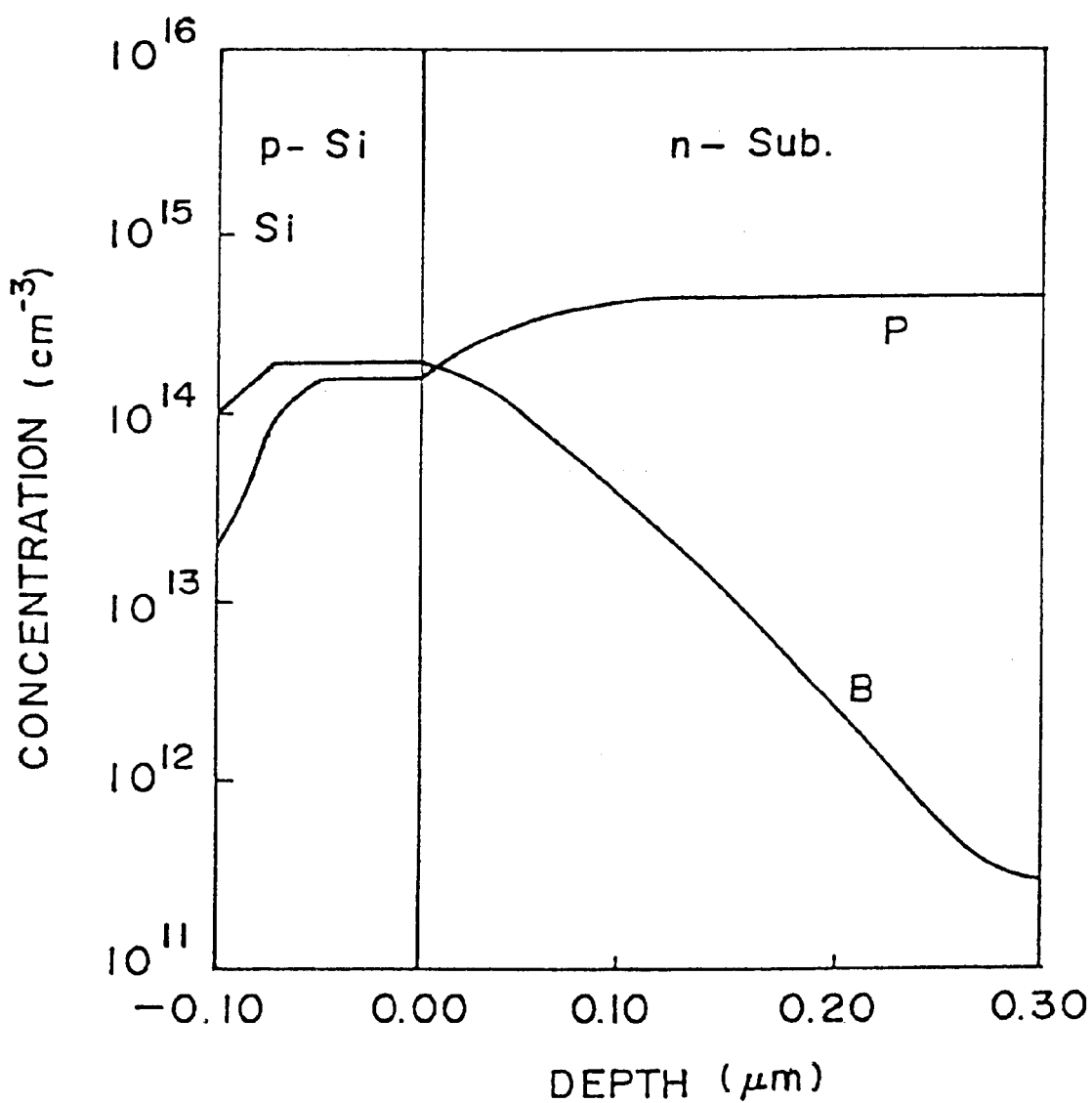
FIG. 11 is another diagram showing the principle of the present invention.

FIG. 11 shows the result of a comparative experiment of the experiment of FIG. 10 in which the SiN layer 1B is omitted. Similarly to the case of FIG. 10, the Si substrate 1 is doped to the $n^+$-type and the epitaxial layer 1A is doped to the p-type, and the distribution profile of B and P represents the result after a thermal annealing process conducted at 1000° C. for about 30 minutes.

Referring to FIG. 11, it can be seen that there occurs a substantial diffusion of P in the epitaxial layer 1A from the Si substrate 1. Further, it is also clear that a substantial diffusion of B occurs also from the epitaxial layer 1A to the Si substrate 1. Thus, when a protection circuit of FIG. 2 is formed in the epitaxial layer thus doped with P, the protection circuit does not operate properly and there may be caused an electrostatic damaging associated with the voltage surge.

Figure 12:
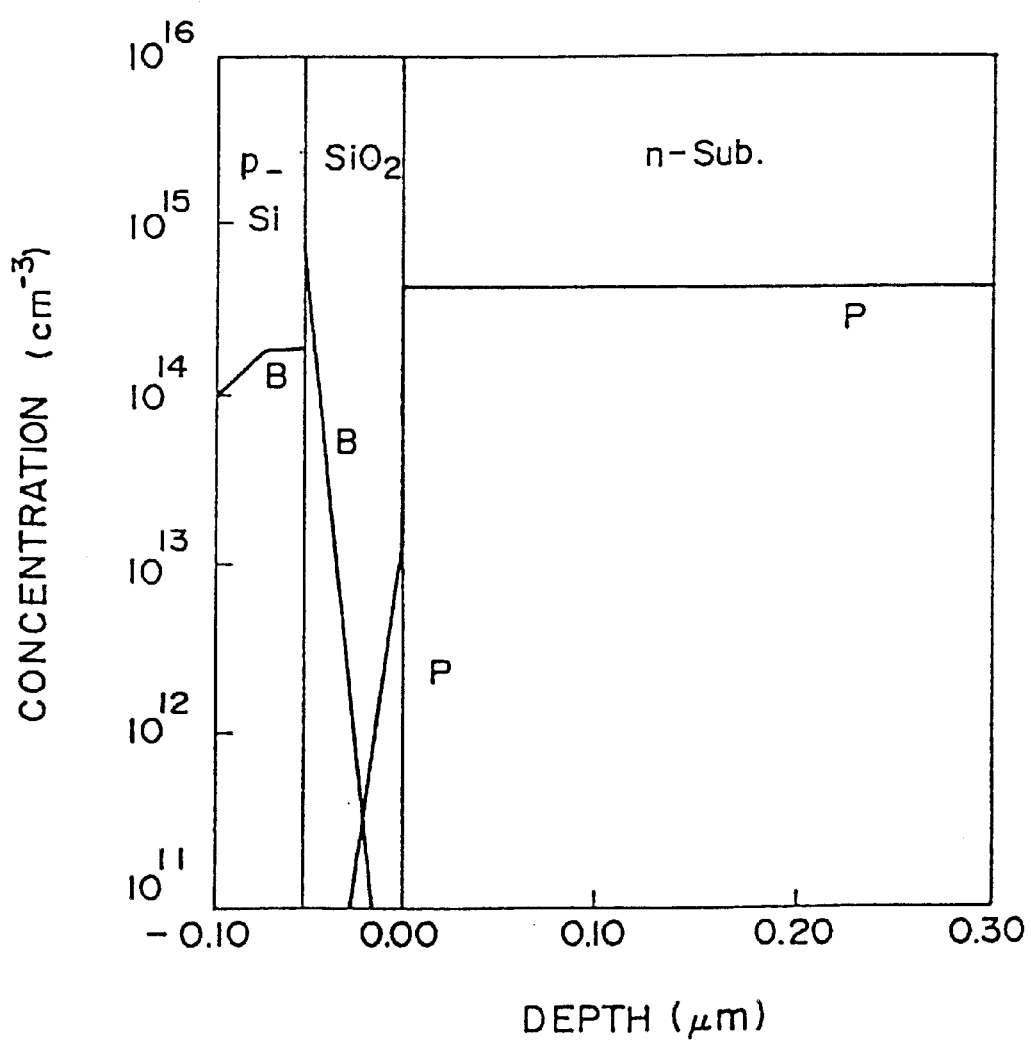
FIG. 12 is another diagram showing the principle of the present invention.

FIG. 12 shows the distribution profile of B and P in the epitaxial substrate similar to the epitaxial substrate of FIG. 10 except that an $SiO_2$ layer having a thickness of about 0.05 μm is used for the high resistance layer 1B. Similarly to the experiment of FIG. 10, the distribution profile is for the case in which a thermal annealing process at 1000° C. is applied for 30 minutes.

Referring to FIG. 12, it can be seen that the diffusion of P from the highly doped Si substrate 1 into the epitaxial layer 1A is effectively blocked also in the case in which such an $SiO_2$ layer is used for the high-resistance layer 1B.

FIRST EMBODIMENT

Figure 13:
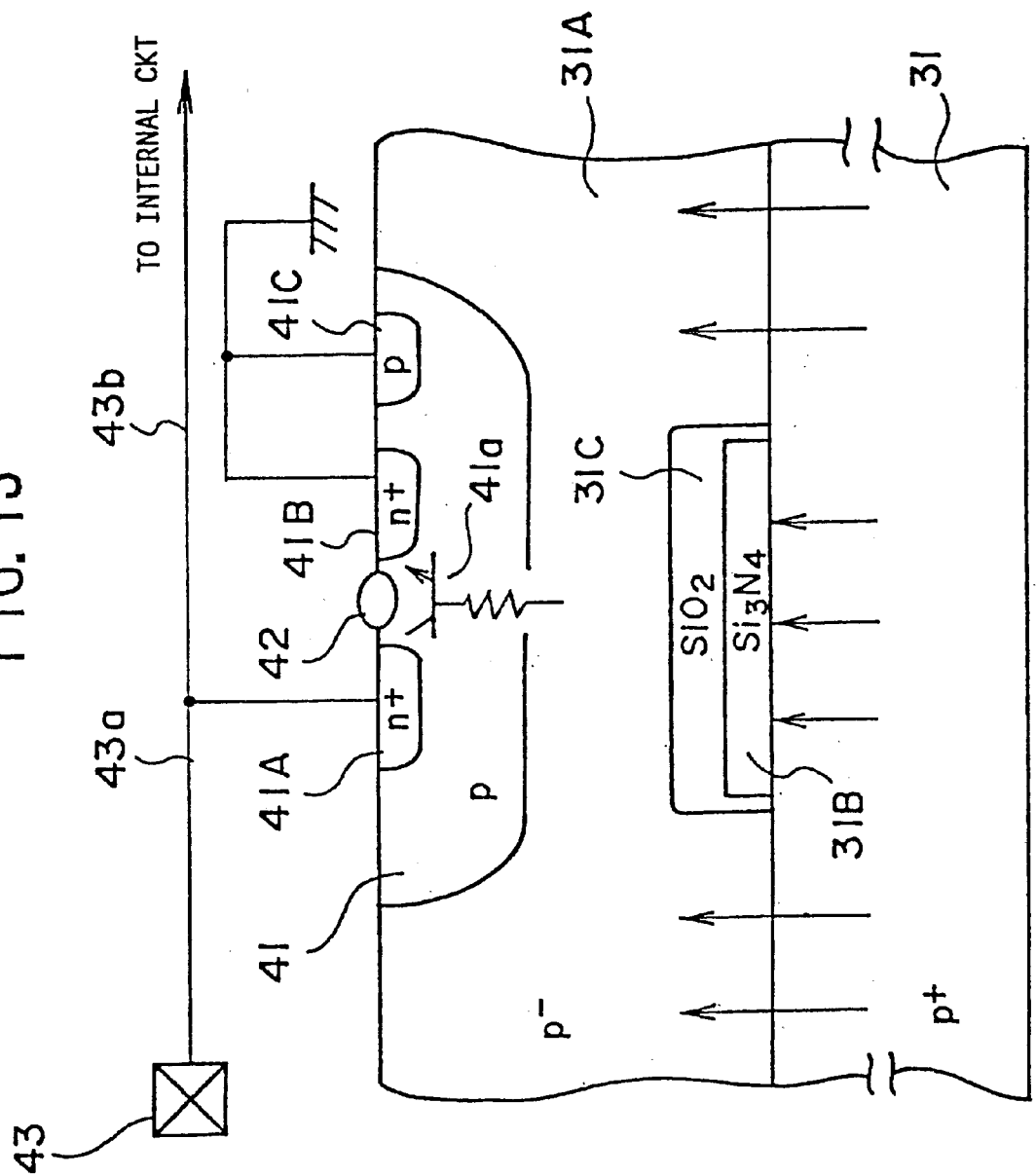
FIG. 13 is a diagram showing the construction of a semiconductor device according to a first embodiment of the present invention.

FIG. 13 shows the construction of a semiconductor device according to a first embodiment of the present invention.

Referring to FIG. 13, the semiconductor device of the present embodiment is constructed on an epitaxial substrate formed on a Si substrate 31 of the $p^+$-type, wherein the substrate 31 may be doped by B with a concentration level of about $1\times10^{19} cm^{-3}$ and may have a very low volume resistivity of about 0.01 Ω·cm. Further, the epitaxial substrate includes an epitaxial layer 31A of the $p^-$-type Si doped by B on the Si substrate 31 with a thickness of about 5 μm.

On the epitaxial layer 31A of the $p^-$-type, there is formed a p-type well 41, while the p-type well 41 is formed with diffusion regions 41A and 41B of the $n^+$-type such that the diffusion regions 41A and 41B are formed at both lateral sides of a field oxide film 42. Further, the p-type well 41 includes a diffusion region 41C of the p-type, wherein the diffusion region 41B of the $n^+$-type and the diffusion region 41C of the p-type are grounded. Thus, the p-type well 41 is formed therein with a protection circuit for electrostatic damaging similar to the one described with reference to FIG. 2.

Figure 1:
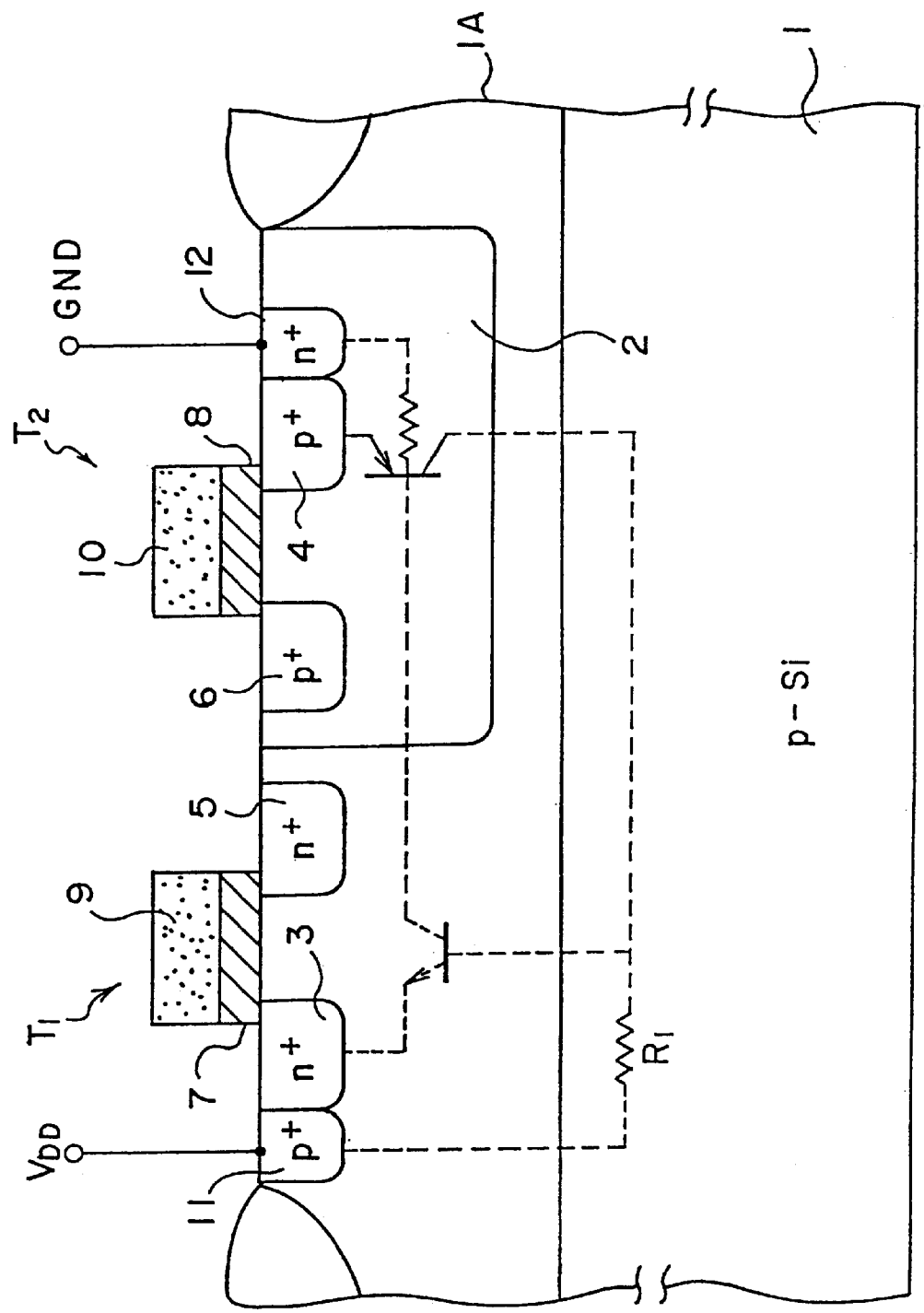
FIG. 1 is a diagram showing the problem of CMOS latch-up occurring in a CMOS device formed on a conventional epitaxial substrate.

On the other hand, the diffusion region 41A of the $n^+$-type is connected to an input or output electrode pad 43 via a conductor pattern 43a and further to an internal circuit, which may include a CMOS circuit of FIG. 1, via a conductor pattern 43b.

In the semiconductor device of the present embodiment, it should be noted that there is formed an SiN pattern 31B having a thickness of about 0.1 μm on the Si substrate 31 such that the SiN pattern 31B is located right underneath the p-type well 41, and the SiN pattern 31B is covered by an $SiO_2$ film 31C having a thickness of about 0.1 μm, wherein the SiN pattern 31B and the $SiO_2$ film 31C thereon form together a high-resistance structure corresponding to the high-resistance layer 1B of FIG. 7 described previously. Further, the high-resistance structure thus formed acts also as an effective barrier layer for blocking the diffusion of B from the semiconductor substrate 31 to the epitaxial layer 31A.

In the fabrication process of the epitaxial substrate, the SiN pattern 31B and the SiO$_2$ pattern 31C are formed by an ordinary CVD process, and the epitaxial layer 31A is grown on the Si substrate 31 thus carrying the patterns 31B and 31C by a lateral epitaxial overgrowth (ELO) process such that the epitaxial layer 31A covers the SiO$_2$ pattern 31C, and hence the SiN pattern 31B located thereunder. More in detail, an Si layer of the p$^-$-type, containing therein B with a concentration level of about $1 \times 10^{14}$ cm$^{-3}$ is deposited on the Si substrate 31 after the step of formation of the SiO$_2$ pattern 31C by a CVD process, wherein the Si layer thus deposited tends to include a polysilicon region in correspondence to the part covering the SiO$_2$ pattern 31C. The polysilicon region thus formed is subsequently converted to a single crystal region by an annealing process such that a recrystallization occurs in the polycrystal region in such a manner that the recrystallization proceeds laterally from the single crystal region surrounding the polysilicon region.

Figure 14A:
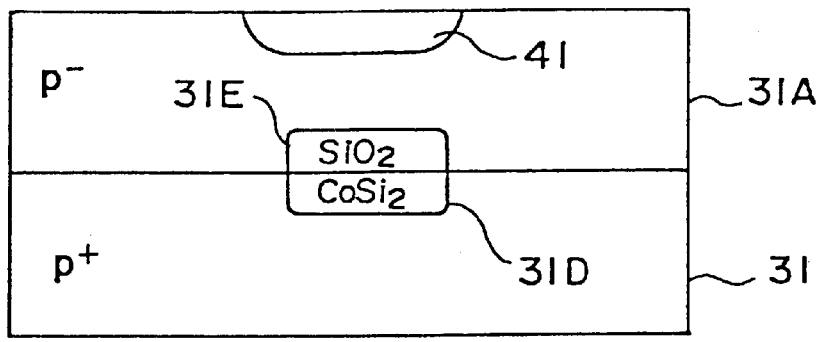
FIGS. 14A–14C are diagrams showing various modifications of the first embodiment.
Figure 14B:
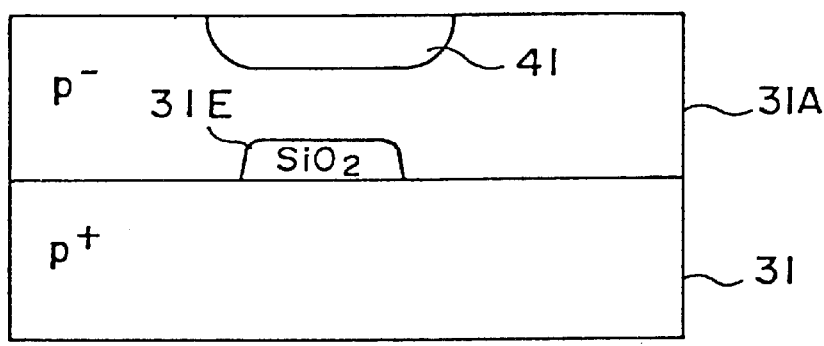
Figure 14C:
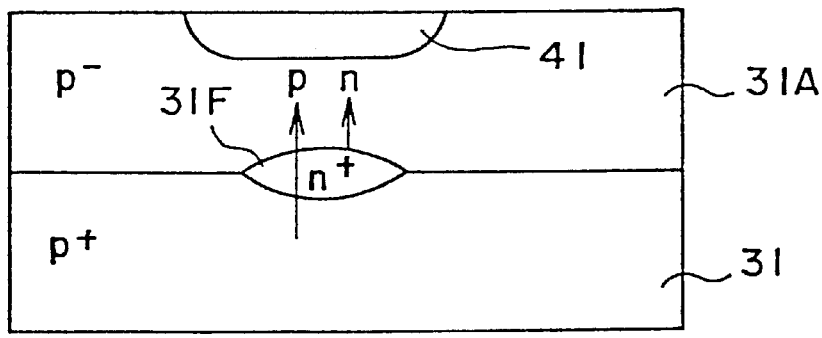

FIGS. 14A–14C show various modifications of the semiconductor device of the first embodiment, wherein those parts corresponding to the parts described previously are designated by the same reference numerals and the description thereof will be omitted.

Referring to FIG. 14A, it can be seen that the Si substrate 31 of the p$^+$-type includes a diffusion barrier layer 31D of a refractory metal silicide such as CoSi$_2$ in correspondence to the foregoing p-type well 41, and a high resistance pattern 31E of SiO$_2$ is formed so as to cover the diffusion barrier layer 31D. In the construction of FIG. 14A, it should be noted that the diffusion of B from the Si substrate 31 to the epitaxial layer 31A is blocked by the CoSi$_2$ pattern 31D, while the current path underneath the p-type well 41, in which the protection circuit is formed, is interrupted by the SiO$_2$ pattern 31E. It should be noted that the diffusion barrier layer 31D is not limited to CoSi$_2$ but other refractory metal silicide such as TiSi$_2$, MoSi$_2$ or WSi$_2$ may also be used.

The refractory metal silicide layer 31D of FIG. 14A may be formed easily by depositing a refractory metal pattern (not shown) on the Si substrate, followed by a thermal annealing process to cause a reaction between the refractory metal pattern and the Si substrate such that the desired refractory metal silicide is formed. After the region 31D of the refractory metal silicide is thus formed, the remaining refractory metal is removed from the surface of the Si substrate 31 by a wet etching process.

After the formation of the refractory metal silicide region 31D, the SiO$_2$ pattern 31D is provided so as to cover the region 31D, and the epitaxial substrate 31A is grown so as to cover the SiO$_2$ pattern 31D similarly to the case of forming the structure of FIG. 13.

In the modification of FIG. 14B, on the other hand, the SiO$_2$ pattern 31E is used both as the high-resistance layer and the diffusion barrier layer. Thereby, it is no longer necessary to form the refractory metal silicide region 31D in the substrate 31 and the fabrication process of the epitaxial substrate is simplified.

Further, in the modification of FIG. 14C, a Si pattern 31F, doped by P or As to the n$^+$-type, is formed on the Si substrate 31 of the p$^+$-type epitaxially in correspondence to the p-type well 41, and the epitaxial layer 31A is formed so as to cover the foregoing Si pattern 31F.

In the construction of FIG. 14C, it should be noted that the n$^+$-type Si pattern 31F does not act as an effective diffusion barrier. On the other hand, the n$^+$-type Si pattern 31F forms a p-n junction with the underlying Si substrate 31 of the p$^+$-type or with the Si epitaxial layer 31A of the p$^-$-type, and the depletion region associated with the p-n junction acts as an effective high-resistance layer corresponding to the high-resistance layer 1B of FIG. 7. Further, it should be noted that the n$^+$-type region 31F releases the n-type dopant toward the surface of the epitaxial layer 31A similarly to the Si substrate 31 when a thermal annealing process is applied, wherein it should be noted that the n-type dopants thus released tend to neutralize the p-type dopants that are released by the p$^+$-type substrate 31 and migrating to the surface of the epitaxial layer 31A. Thus, there is formed a region of high-resistance, in which the carrier density is reduced, generally in correspondence to the n$^+$-type region 31F. The construction of the epitaxial substrate of FIG. 14C is also effective for ensuring a normal operation of the protection circuit.

As the n$^+$-type region 31F is formed epitaxially on the Si substrate 31, the formation of the epitaxial layer 31A occurs spontaneously by merely depositing a p$^-$-type Si layer on the Si substrate and the need of the ELO process is eliminated in the modification of FIG. 14C.

SECOND EMBODIMENT

FIGS. 15A–15C are diagrams showing a fabrication process of a semiconductor device according to a second embodiment of the present invention, wherein those parts corresponding to the parts described previously are designated by the same reference numerals and the description thereof will be omitted.

Referring to FIG. 15A, the p$^-$-type Si epitaxial layer 31A on the p$^+$-type Si substrate 31 has a thickness of typically about 2 $\mu$m, and a resist pattern 51 is formed on the epitaxial layer 31A with a thickness of typically 2.5–2.6 $\mu$m. The resist pattern 51 is formed with an opening 51A. It is preferable that the resist pattern 51 can maintain the shape thereof stably even when the thickness of the resist is increased to several microns. In this regard, the use of a resist marketed by Sumitomo Chemical Co., LTD. under the trade name of PF147B, or a resist marketed by Japan Synthetic Rubber Co., LTD., is preferable.

Next, in the step of FIG. 15B, an ion implantation process of P is conducted while using the resist pattern 51 as a mask, such that the P$^+$-ions are introduced into a region 31 of the epitaxial layer 31A located in the vicinity of the interface between the Si substrate 31 and the epitaxial layer 31A, wherein the ion implantation process may be conducted under the acceleration energy of about 1.5 MeV and with the dose of about $1 \times 10^{13}$ cm$^{-2}$. While the ion implantation process used in the present embodiment requires a relatively large acceleration voltage, such a large acceleration voltage can be realized when the Model G1520 apparatus of Genus, Inc. California, U.S.A. is used for the ion implantation process.

Next, in the step of FIG. 15C, the resist pattern 51 is removed and the epitaxial substrate thus introduced with P is subjected to a thermal annealing process conducted at 1000° C. for about 30 minutes. As a result of the thermal annealing process, the P ions introduced in the step of FIG. 15B form a high-resistance region 31H in the epitaxial layer 31A at the location slightly above the interface between the Si substrate 31 and the epitaxial layer 31A.

Further, the diffusion region 41 of the p-type is formed in the epitaxial layer 31A in the step of FIG. 15C such that the diffusion region 41 is located above the high-resistance region 31H. It should be noted that the diffusion region 41 may be formed simultaneously to the high-resistance region 31H, by introducing B ions in the step of FIG. 15B to a surface region of the epitaxial layer 31A while using the same resist pattern 51 as a mask.

As explained already with reference to FIGS. 8 and 9, the ion implantation of P in the step of FIG. 15B is conducted by setting the dose such that the hole formation by the B ions diffused into the epitaxial layer 31A from the substrate 31 is substantially compensated for by the P ions. Thereby, it should be noted that the dose of P may be set higher such that not only the hole formation is compensated but also the formation of electrons is induced. In such a case, there is formed an n-type or n$^+$-type region in correspondence to the foregoing region 31H, while such an n-type region is also effective for forming a high resistance region as a result of the formation of a p-n junction and associated formation of a depletion region between the n-type region H and the adjacent p-type epitaxial layer 31A or the semiconductor substrate 31. Further, it should be noted that the effect of decreasing the hole concentration level and the associated effect of increasing the resistance are achieved in the region 31H even when the dose of the P ions in the region 31H is small and the compensation of the holes is insufficient.

In the present embodiment, it should be noted that the formation of the high-resistance region 31H can be made after the epitaxial substrate is produced. Further, there is no need of specific growth process such as the LEO process when forming the high-resistance region 31H.

Further, it should be noted that the present invention is applicable also to the case in which the conductivity type is reversed, as explained with reference to FIGS. 10–12.

Further, the protection circuit formed in the well 41 is not limited to the one explained with reference to FIG. 2 but a protection circuit shown in FIG. 16 may also be used.

Figure 16:
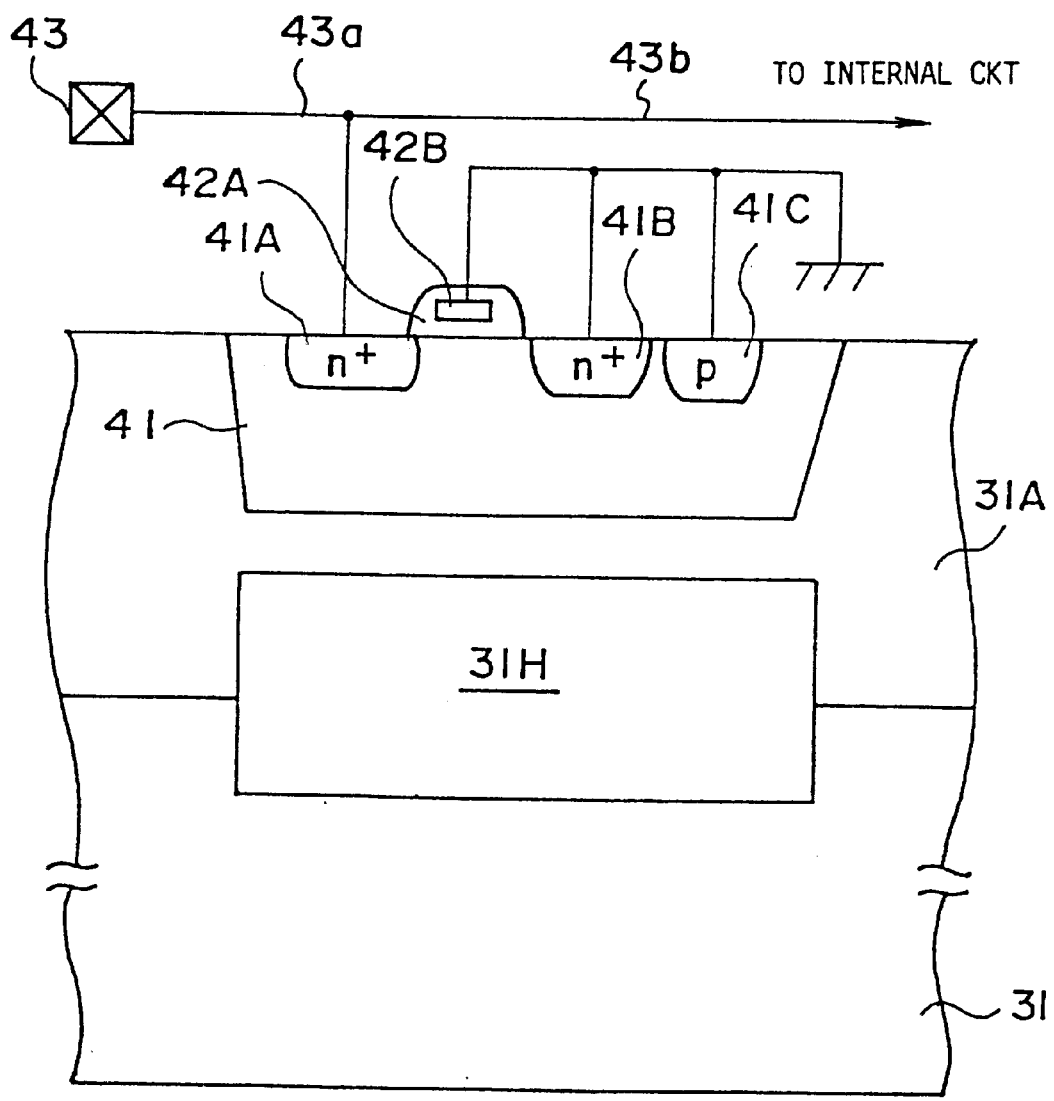
FIG. 16 is a diagram showing an alternative example of a protection circuit which can be used in the present invention.

Referring to FIG. 16, in which those parts corresponding to the parts described previously are designated by the same reference numerals, it can be seen that the field oxide film 42 in the embodiment of FIG. 13 is replaced by a gate insulation film 42A and a gate electrode 42B thereon, wherein the gate electrode 42 grounded together with the diffusion region 41B.

Further, the present invention is not limited to the embodiments described heretofore, but various variations and modifications may be made without departing from the scope of the invention.

What is claimed is:

1. A method of fabricating a semiconductor device, comprising the steps of:
    forming a barrier layer on a semiconductor substrate doped with an impurity element to a first impurity concentration level, said barrier layer blocking a diffusion of said impurity element thereinto;
    forming an epitaxial layer containing said impurity element with a second impurity concentration level substantially smaller than said first impurity concentration level, on said semiconductor substrate such that said epitaxial layer covers said barrier layer; and
    forming an active device on said epitaxial layer.

2. A method as claimed in claim 1, wherein said step of forming said barrier layer includes a step of depositing a pattern of an insulating material selected from a group consisting of $SiO_2$ and SiN on said substrate.

3. A method as claimed in claim 1, wherein said step of forming said barrier layer includes the steps of: depositing a pattern of a refractory metal on said semiconductor substrate; causing a reaction between said pattern of said refractory metal and said semiconductor substrate to form a refractory metal compound in said semiconductor substrate; and removing said refractory metal remaining on said semiconductor substrate.

4. A method as claimed in claim 3, further including a step of forming an insulation pattern on said semiconductor substrate such that said insulation pattern covers a region of said semiconductor substrate in which said refractory metal compound is formed.

5. A method of fabricating a semiconductor device, comprising the steps of:
    forming an epitaxial layer on a semiconductor substrate doped by a first impurity element with a first impurity concentration level, such that said epitaxial layer contains said first impurity element with a second impurity concentration level substantially smaller than said first impurity concentration level, said semiconductor substrate and said epitaxial layer thereby forming an epitaxial substrate; and
    introducing a second impurity element of a conductivity type opposite to a conductivity type of said first impurity element, into said epitaxial substrate in the vicinity of an interface between said semiconductor substrate and said epitaxial layer by an ion implantation process.

6. A method as claimed in claim 5, wherein said step of introducing said second impurity element is conducted with a dose set such that there occurs a depletion of carries in a region in which, said second impurity element is introduced.

7. A method as claimed in claim 5, wherein said step of introducing said second impurity element is conducted under an acceleration energy set such that said second impurity element is impinged to a depth generally corresponding to said interface between said semiconductor substrate and said epitaxial layer.

8. A method as claimed in claim 5, wherein said step of introducing said second impurity element is conducted under an acceleration energy set such that said second impurity element is introduced to a depth in the vicinity of said interface between said semiconductor substrate and said epitaxial layer but shallower than said interface.

9. A method as claimed in claim 5, wherein said step of introducing said second impurity element is conducted with a dose set such that a concentration level of said second impurity element exceeds a concentration level of said first impurity element in a region in which said second impurity element is introduced.

10. A method as claimed in claim 5, wherein said ion implantation process is conducted by using a mask formed on said epitaxial layer.

11. A method as claimed in claim 5, further including the step of forming a protection circuit against electrostatic damaging in a part of said epitaxial substrate located immediately above a region in which said second impurity element is introduced.

* * * * *